July 2, 1963 M. R. LOMASK 3,096,488

ELECTRONIC FILTER

Filed Sept. 14, 1961 6 Sheets-Sheet 1

INVENTOR.
MORTON R. LOMASK

BY Philip Schneider
ATTORNEY

July 2, 1963

M. R. LOMASK 3,096,488

ELECTRONIC FILTER

Filed Sept. 14, 1961

6 Sheets-Sheet 2

INVENTOR.
MORTON R. LOMASK
BY
Philip Schneider
ATTORNEY

INVENTOR.
MORTON R. LOMASK
BY
Philip Schneider
ATTORNEY

INVENTOR.
MORTON R. LOMASK
BY
Philip Schneider
ATTORNEY

INVENTOR.
MORTON R. LOMASK
BY
Philip Schneider
ATTORNEY

July 2, 1963 M. R. LOMASK 3,096,488

ELECTRONIC FILTER

Filed Sept. 14, 1961 6 Sheets-Sheet 6

INVENTOR.
MORTON R. LOMASK
BY Philip Schneider
ATTORNEY

United States Patent Office 3,096,488

Patented July 2, 1963

3,096,488

ELECTRONIC FILTER

Morton R. Lomask, New York, N.Y., assignor to the United States of America as represented by the Secretary of the Navy Filed Sept. 14, 1961, Ser. No. 138,206
4 Claims. (Cl. 330—69)

This invention relates to improvements in electronic filters and especially to low-frequency electronic filters capable of providing a high degree of selectivity.

In applications in which a signal of one frequency must be extracted from a noisy background consisting of noise extending over a wide range of frequencies including the frequency of the desired signal, a filter having a high degree of selectivity is a useful instrumentality. When tuned to the frequency of the desired signal, it permits the desired signal to be received but sharply attenuates the noise.

An object of the invention is to provide an electronic filter having high Q or selectivity.

Another object is to provide an electronic filter having variable Q or selectivity.

A further object is to provide an electronic filter in which the center frequency is variable.

Yet another object is to provide an electronic filter in which the frequency and selectivity controls have no effect on each other.

Still another object is to provide an electronic filter having a pass-band characteristic which does not eventually flatten out but continues to decrease with frequency on both sides of the center frequency.

Other objects and many of the attendant advantages of this invention will be readily appreciated as the same becomes better understood by reference to the following detailed description when considered in connection with the accompanying drawings wherein:

FIG. 4 is the response curve of the embodiment of the invention shown in FIGS. 1 and 2;

Figure 1:
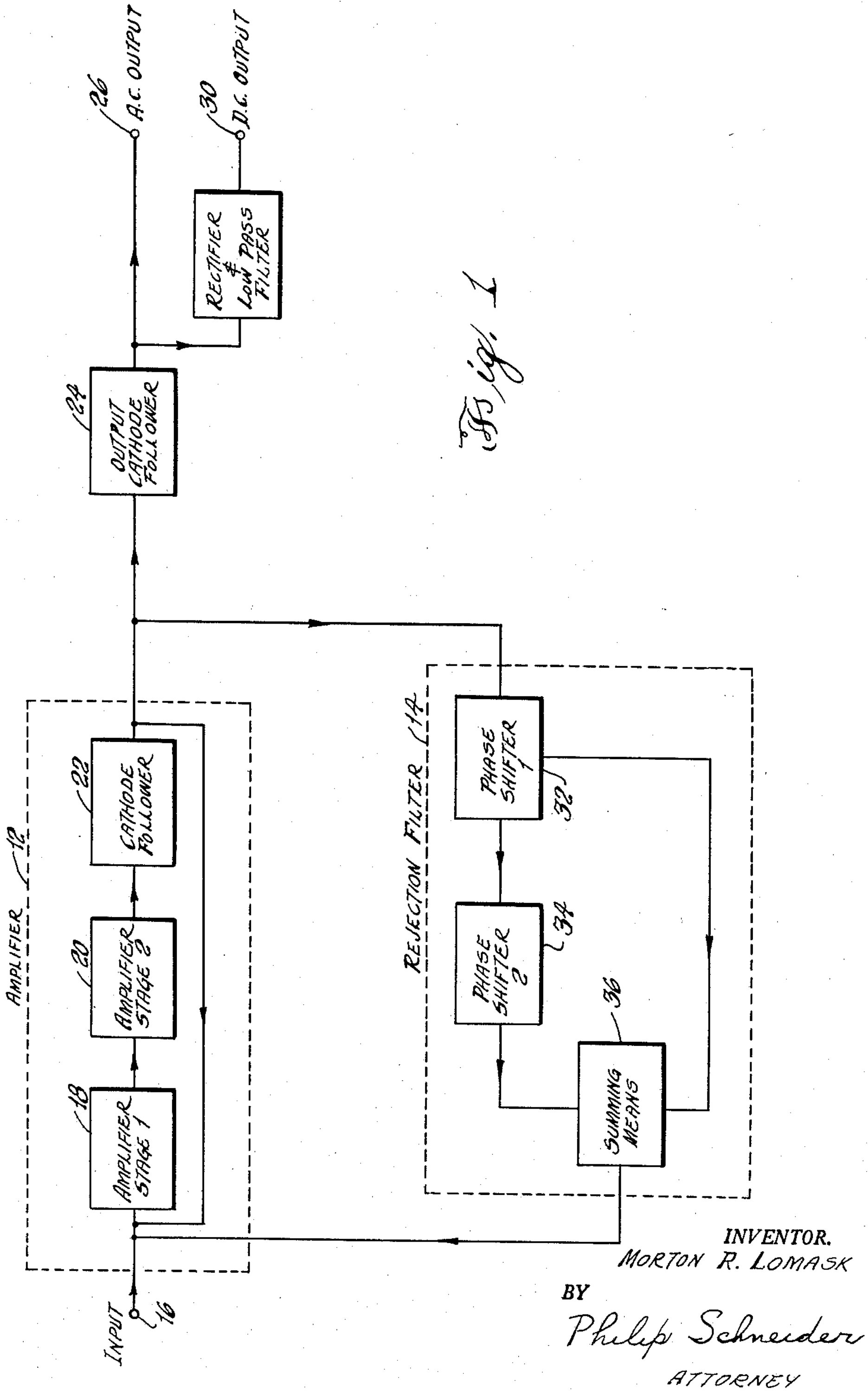
FIG. 1 is a block diagram of an embodiment of the invention.
Figure 3:
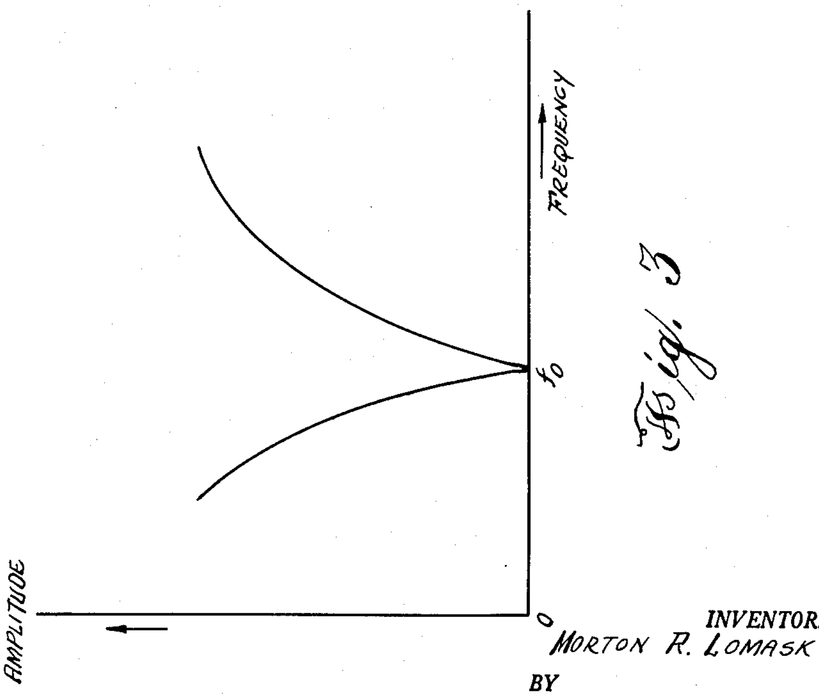
FIG. 3 is the response curve of the rejection filter.

In FIG. 1, the block diagram of an embodiment of the electronic filter is shown. The filter basically consists of an amplifier 12 and a rejection filter 14. The input signal, which may, for example, consist of a continuous-wave (C.W.) signal in a noisy background where the noise frequencies range in a continuous spectrum below and above the signal frequency, is applied to the amplifier 12. The output of the amplifier 12 is fed to the rejection filter 14 which provides an output having the amplitude vs. frequency characteristic shown in FIG. 3, that is, the amplitude of its output signal decreases with frequency until a null is reached at the center of tuned frequency $f_0$ of the rejection filter and then sharply increases again. The output of the rejection filter 14 is fed back negatively, or degeneratively, to the input of the amplifier 12 and the result of the combined inputs is the amplitude versus frequency characteristic shown in FIG. 4, a sharp peak at the center frequency $f_0$ of the electronic filter and a sharp drop-off on either side of the center frequency.

From FIG. 1, the amplifier 12 may be seen to consist of a first amplifier stage 18, a second amplifier stage 20 and a cathode follower stage 22. The rejection filter 14 consists of a first phase shifter 32, a second phase shifter 34 and a summing means 36. The output of the amplifier 12 is fed to an output cathode follower 24 from which an A.C. output signal is obtained at terminal 26. The output of the cathode follower 24 is also fed into a rectifier and low pass filter 28 to provide a D.C. output at terminal 30.

Figure 2:
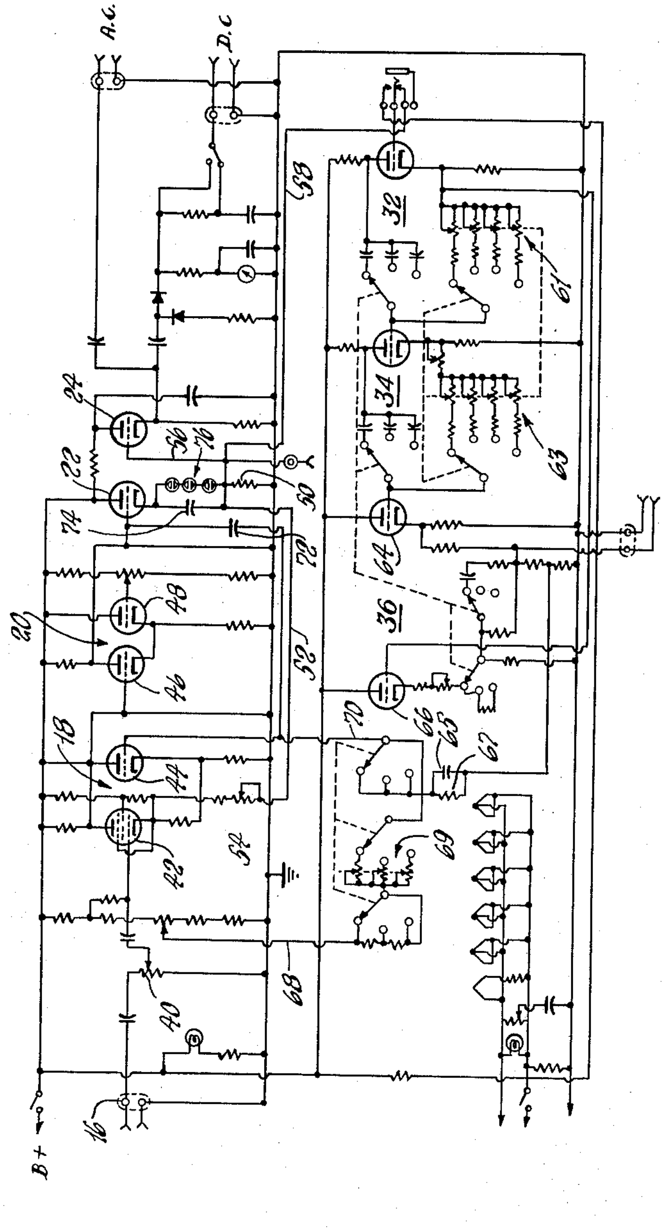
FIG. 2 is a schematic circuit diagram of the embodiment of the invention shown in FIG. 1.
Figure 2:
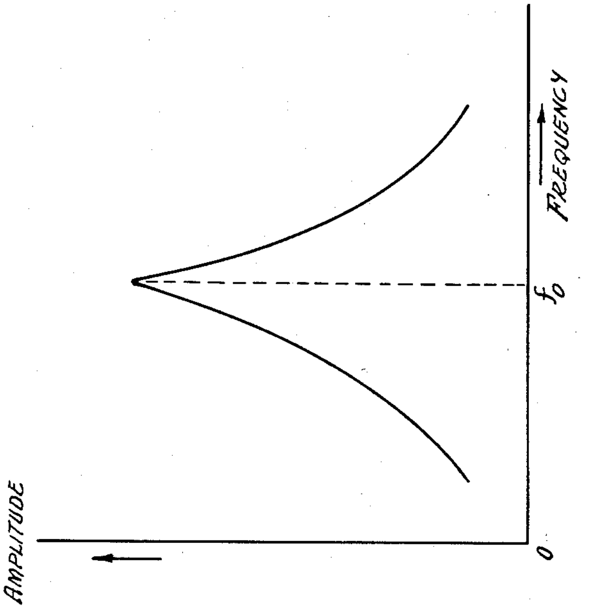

Full details of the circuit are shown in FIG. 2. The input signal is fed to an attenuator 40 before being applied to the first amplifier stage 18 consisting of a pentode amplifier tube 42 which is cathode-coupled to a triode amplifier tube 44. The output of the pentode 42 is fed directly to the grid of the second amplifier stage 20 which comprises a pair of cathode-coupled triode amplifier tubes 46 and 48. The output of the second amplifier stage 20 is taken from the plate of triode 46 and fed directly to the grid of the cathode follower 22. It should be noted that the amplifier stages and the output cathode follower 24 are D.C. coupled.

Three outputs are taken from the cathode resistor 50 of cathode follower 22. The first of these outputs is fed back via lead 52 through a gain control comprising variable resistor 54 to the cathode of the pentode amplifier section 42 of the first amplifier stage 18 to provide conventional degenerative feedback for the amplifier. This provides stabilization for the amplifier 12 as well as a means of controlling its gain.

The second of the amplifier outputs is fed to the grid of the output cathode follower 24 via lead 56.

Figure 6:
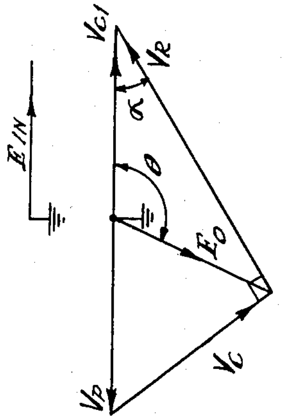
FIG. 6 is a vector diagram showing the phase relationships of various voltages in the phase shifter shown in FIG. 5.
Figure 5:
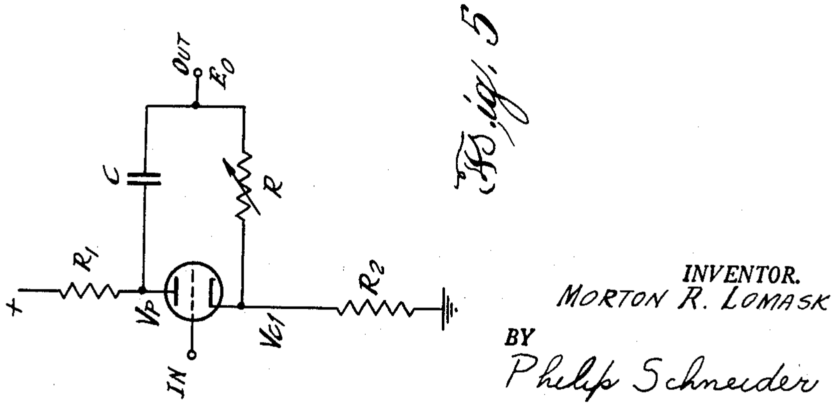
FIG. 5 is a simplified schematic diagram of the type of phase shifter employed in this invention.

The third of the amplifier outputs is fed via lead 58 to the grid of the first phase shifter 32. Each of the phase shifters 32 and 34 consists of a phase splitter and a phase-shifting network and is capable of shifting the phase of an applied signal by nearly 180 degrees. (For a full 180° phase shift, the phase shift resistor R would have to have infinite resistance.) A simplified diagram of the type of phase shifter which is employed herein is shown in FIG. 5. Plate and cathode resistors $R_1$ and $R_2$ are equal. The vector diagram showing the voltage relations existing in the phase shifter is shown in FIG. 6. The output voltage vector $E_0$ can be varied in phase substantially from the position of the plate voltage vector Vp to the position of the cathode voltage vector $V_{c1}$. This is a variation in phase of substantially 180 degrees. In the actual circuit, three different values of condenser C and four different values of resistor R may be selected. This permits the selection of one of three frequency ranges, each of which is subdivided into four subranges of frequency, over which subranges the center frequency of the filter may be moved by means of the phase-shifting variable resistors 61 and 63. Since the output of the first phase shifter 32 is fed to the grid of the second phase-shifter amplifier tube, a total phase shift of almost 360 degrees can be obtained.

The unphase-shifted signal coming from the amplifier 12 is tapped off the cathode of the first phase shifter 32, and the phase-shifted and the unphase-shifted signals are applied to the summing means 36. The summing means 36 comprises a pair of triode cathode-follower amplifiers and a resistive summing network. The first amplifier 64 is used to amplify the phase-shifted signal and the second amplifier 66 is used to amplify the unphase-shifted signal. One of the cathode resistors of the second amplifier 66 is variable so that the amplitude of the phase-shifted and unphase-shifted signals can be balanced before they are summed. The summed signal is fed back degeneratively through a resistor 67 and lead 70 to the control grid of the triode tube 44 of the first amplifier stage 18. The grid of the triode 44 is also connected through variable resistors 69 to the source of bias for the pentode amplifier tube 42. The series resistor 67 to the triode grid and the variable resistors 69 from the triode grid to the bias supply form a voltage-dividing network. The circuit is designed so that the D.C. levels at the triode grid and at the point on the summing means 36 from which the summed signal is derived are approximately equal. Thus, variation in value of the variable resistors 69 affects the bias on the triode grid negligibly, but permits the amount of summed-signal feedback to the triode grid to be effectively controlled so that the Q, or selectivity, of the device can be varied from about 2 to 200.

The center frequency $f_0$ of the filter is the frequency at which the phase-shifted signal exactly cancels out the unphase-shifted signal. This cancellation can occur only when the phase-shifted signal is shifted 180 degrees. The more the frequency varies from the center frequency, the smaller is the amount of cancellation that occurs and the greater is the degeneration of the input. Thus, the variable resistors R, which are the phase shift controls constitute the frequency control of the device.

An important feature of the present invention is the high selectivity it provides. Selectivity in this type of filter depends on the gain that can be attained by the wideband amplifier 18, the phase versus frequency characteristics of the phase shifters 32 and 34, and the amount of summed-signal feedback to the input of the wideband amplifier 18. However, simply increasing the gain of the amplifier 18 leads to oscillation. To avoid low-frequency oscillation, the system is designed with D.C. coupling; to suppress high-frequency oscillation, a small trimmer capacitor 72 is connected from the output of the amplifier 12 to its input. (In actual practice, the capacitor is connected to the grid of the cathode follower 22 rather than to its cathode which is the true output of amplifier 12. From the point of view of operation of the circuit, the grid connection is equivalent to the cathode connection since the character of the grid and cathode signals of a cathode follower are the same except for a difference in amplitude.) High frequency oscillation which could be initiated by the voltage-dropping neon tube 76 is also suppressed by a capacitor 74. A third capacitor 65, for suppressing high-frequency oscillation, is connected across the series resistor 67 from the output of the summing means 36 to the grid of the triode tube 44.

A most important feature of this invention is that the selectivity control is completely independent of the frequency of the filter and vice versa; there is no interaction between them. This results from the fact that the selectivity, or Q, of the filter is controlled by varying the amount of summed signal which is fed back to the input of the amplifier 12 from the rejection filter 14 by means of the variable resistors 69. Since these resistors have no effect on the phase shift and hence on the frequency of the device and since the phase-shifting variable resistors (frequency controls) have no effect on the amount of feedback, there is no interaction between frequency and selectivity.

Figure 7:
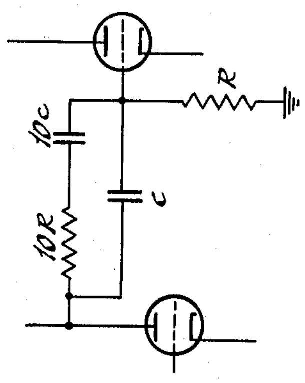
FIG. 7 is a schematic circuit diagram showing the type of A.C. coupling filter employed between amplifier tubes in electronic filters, particularly filters in which the frequencies involved are above 100 c.p.s.

The electronic filter shown in FIG. 2 is used for low-frequency applications up to about 500 cycles; it employs D.C. coupling. For applications above about 500 cycles, it is more convenient to use A.C. coupling between the amplifier stages. However, to prevent oscillations at high gains, the A.C. coupling networks between the amplifier stages should not be the simple condenser-resistor combination but should be the network shown in FIG. 7. A resistor and capacitor are paralleled across the usual capacitor C. The values of the seriesed resistor and capacitor should be approximately ten times the values of the other resistor and capacitor.

Figures 8, 9:
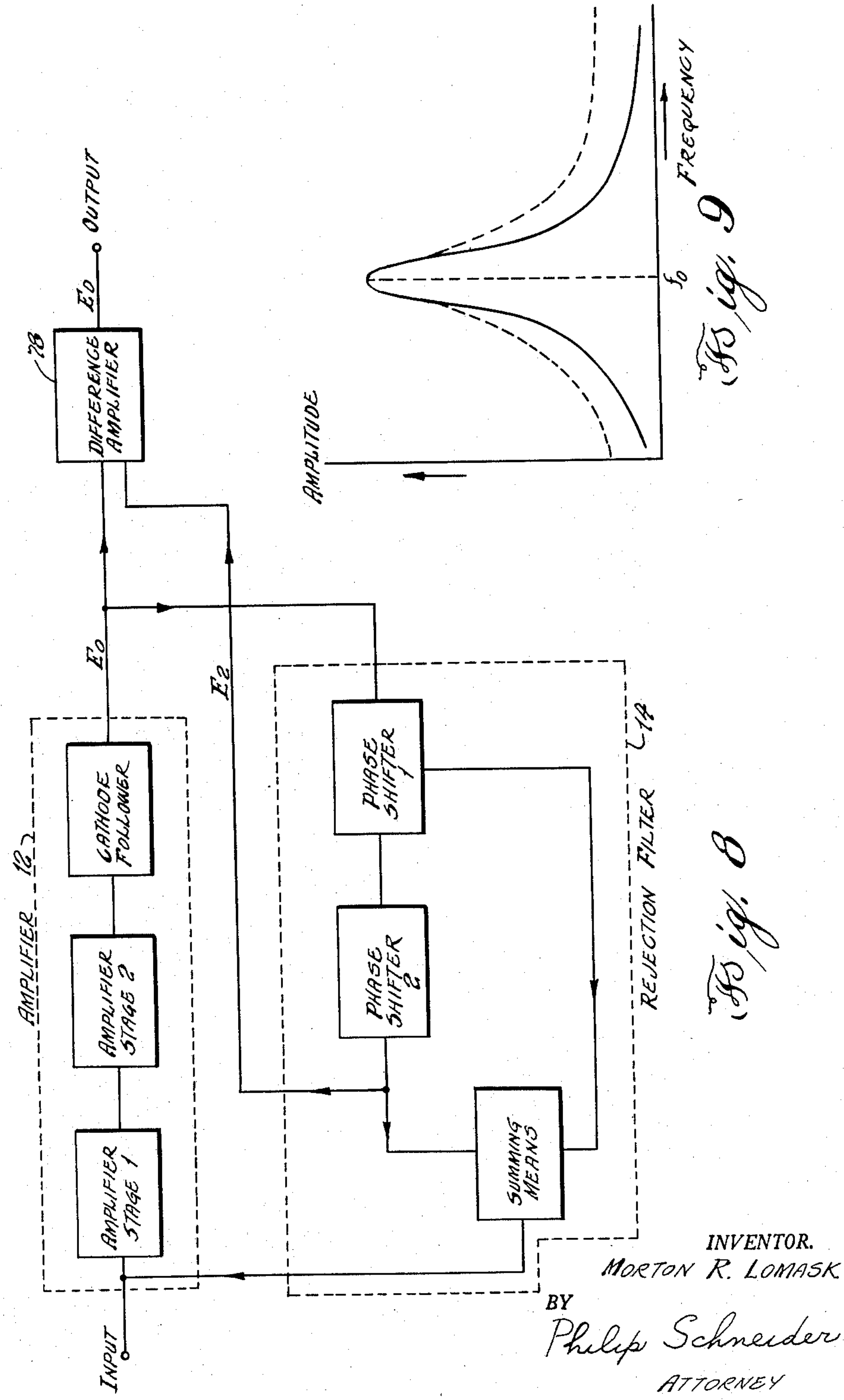
FIG. 8 is a block diagram of a modified version of the invention.
FIG. 9 is the response curve of the version of the invention shown in FIG. 8.

A modified and improved version of the invention is shown in FIG. 8. In this version, the previous output voltage $E_O$, and the phase-shifted signal, $E_2$, are fed into a difference amplifier 78 which subtracts the two signals and amplifies their difference. The new output, $E_D$, has side slopes which drop off much more sharply and which continue to fall as they progress outward in both directions from the center frequency of the filter. This is shown graphically by the solid lines in FIG. 9, the dotted lines being the characteristic of the filter without the difference amplifier. The mathematical relation between the previous output voltage and the new output voltage is:

$$E_D = 4E_o = \frac{\omega_0\omega}{\omega_0^2+\omega^2}$$

where $\omega_0 = 2\pi f_0$, $\omega = 2\pi f$, $f_0$ is the center frequency of the filter and $f$ is the frequency at which the amplitude of the output voltage is being calculated. It can be seen that $$\frac{\omega_0\omega}{\omega_0^2+\omega^2}$$

continues to decrease as $\omega$ increases or decreases from the $\omega_0$ value and, therefore, the output voltage $E_D$ also continues to decrease.

The fact that the sides of the characteristic response curve of this version of the invention do not flatten out but fall off sharply and continue to fall off as the frequency extends to zero or infinity is a third imporant feature of the invention. An instrument whose response curve merely flattens out at some amplitude level above zero cannot be employed in low selectivity (large bandwidth) measurements where the noise and background frequency spectrum extends considerably beyond the center frequency on both sides. This is a typical situation occurring in noise analysis applications, for example.

Figure 10:
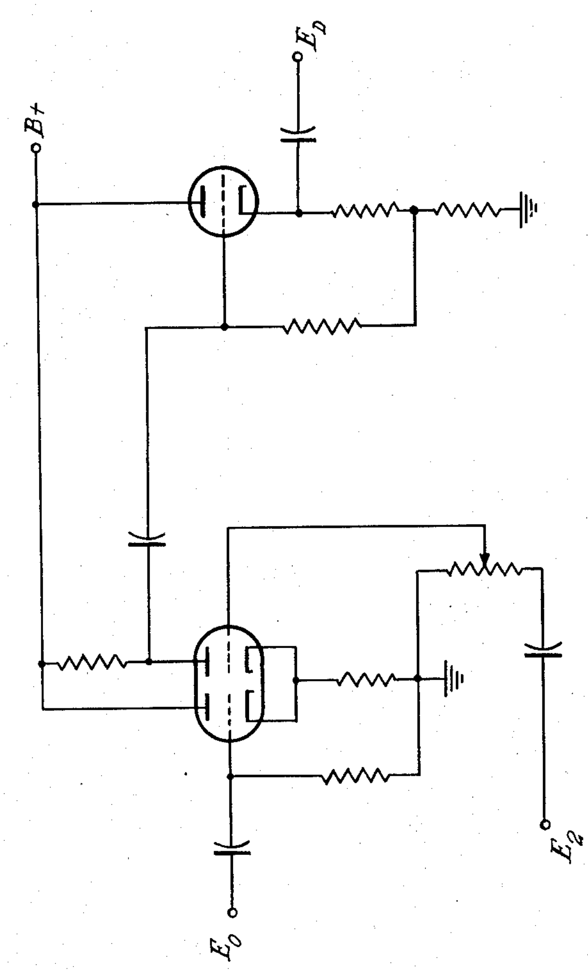
FIG. 10 is a schematic circuit diagram of the difference amplifier used in the version of the invention shown in FIG. 8.

An example of a circuit which can be employed as a difference amplifier is illustrated in FIG. 10. Other difference amplifiers may be employed if desired.

Obviously many modifications and variations of the present invention are possible in the light of the above teachings. It is therefore to be understood that within the scope of the appended claims the invention may be practiced otherwise than as specifically described.

I claim:

1. An electronic filtering device comprising, in combination: a first amplifier having connection means for application of an input signal and connection means for derivation of an output signal; a rejection filter comprising phase-shifting means and summing means, a portion of said amplifier output signal being applied to said phase-shifting means and to said summing means as an input and the phase-shifted output signal of said phase-shifting means also being applied to said summing means as an input, said summing means operating to add its phase-shifted and unphase-shifted input signals, the resultant signal being applied as a negative feedback input signal to said amplifier, said amplifier including means for preventing low-frequency oscillations and means for preventing high-frequency oscillations, said summing means further including signal attenuating means, the summed output signal being passed through said signal attenuating means before being fed back to said amplifier, said signal attenuating means acting as a selectivity control; and a differential amplifier for amplifying the difference between two input signals, the first input being the output signal of said first amplifier and the second input being a portion of said phase-shifted signal, the output of said differential amplifier being the output signal of said electronic filtering device.

2. An electronic filtering device having variable Q and a variable center frequency comprising, in combination: a multistage, wide-band electronic amplifier having an input circuit and an output circuit, said amplifier having D.C. coupling between stages for the minimization of low-frequency oscillation tendencies and a trimmer capacitance connected from the output to the input circuit of said amplifier for the minimization of high-frequency oscillation tendencies; a rejection filter comprising a pair of cascaded phase-shifters and summing means for additively combining input signals applied thereto, a portion of the amplifier output signal being applied to the first of said phase-shifters and to said summing means as an input signal and the phase-shifted output signal of said phase-shifters also being applied as an input signal to said summing means, said summing means further including signal attenuating means, said additively combined signal being passed through said signal attenuating means before being applied as a negative feedback input signal to said amplifier; and a differential amplifier for amplifying the difference between two input signals, the first input being the output signal of said multistage amplifier and the second input being a portion of said phase-shifted signal, the output of said differential amplifier being the output signal of said electronic filtering device.

3. A device as set forth in claim 2, wherein another portion of the multistage amplifier output signal is applied as a negative feedback input signal to said multistage amplifier.

4. An electronic filtering device having variable Q and a variable center frequency comprising, in combination: a multistage, wide-band electronic amplifier having an input circuit and an output circuit, said amplifier having D.C. coupling between stages for the minimization of low-frequency oscillation tendencies and a trimmer capacitance connected from the output to the input circuit of said amplifier for the minimization of high-frequency oscillation tendencies; a rejection filter comprising a pair of cascaded phase-shifters, the phase shift therethrough being variable substantially through 360 electrical degrees thereby providing frequency control, and summing means for additively combining input signals applied thereto, a portion of the amplifier output signal being applied to the first of said phase-shifters and to said summing means as an input signal and the phase-shifted output signal of phase-shifters also being applied as an input signal to said summing means, said summing means further including signal attenuating means, said additively combined signal being passed through said signal attenuating means before being applied as a negative feedback input signal to said amplifier, thereby providing selectivity control; and a differential amplifier for amplifying the difference between two input signals, the first input being the output signal of said multistage amplifier and the second input being a portion of said phase-shifted signal, the output of said differential amplifier being the output of said electronic filtering device.

References Cited in the file of this patent

UNITED STATES PATENTS

| | | |
|---|---|---|
| 1,622,851 | Smith | Mar. 29, 1927 |
| 2,585,639 | Elmore | Feb. 12, 1952 |
| 2,672,529 | Villard | Mar. 16, 1954 |